(12) United States Patent
Shi (10) Patent No.: US 10,446,101 B2
(45) Date of Patent: Oct. 15, 2019

(54) GOA CIRCUIT AND LCD DEVICE (71) Applicant: Shenzhen China Star Optoelectronics Semiconductor Display Technology Co., Ltd., Shenzhen, Guangdong (CN)

(72) Inventor: Longqiang Shi, Guangdong (CN)

(73) Assignee: Shenzhen China Star Optoelectronics Semiconductor Display Technology Co., Ltd., Shenzhen, Guangdong (CN)

(*) Notice: Subject to any disclaimer, the term of this patent is extended or adjusted under 35 U.S.C. 154(b) by 115 days.

(21) Appl. No.: 15/739,683

(22) PCT Filed: Oct. 24, 2017

(86) PCT No.: PCT/CN2017/107546
§ 371 (c)(1),
(2) Date: Dec. 22, 2017

(87) PCT Pub. No.: WO2019/033550
PCT Pub. Date: Feb. 21, 2019

(65) Prior Publication Data
US 2019/0057663 A1 Feb. 21, 2019

(51) Int. Cl.
*G09G 3/36* (2006.01)
*H01L 29/423* (2006.01)
(Continued)

(52) U.S. Cl.
CPC ......... *G09G 3/3677* (2013.01); *G02F 1/1368* (2013.01); *G02F 1/13454* (2013.01);
(Continued)

(58) Field of Classification Search
CPC ......... G09G 3/3677; G09G 2310/0291; G09G 2310/0286; G09G 2310/08;
(Continued)

(56) References Cited

U.S. PATENT DOCUMENTS 9,484,111 B2 * 11/2016 Xiao ............... G11C 19/28
9,627,089 B2 * 4/2017 Qi ................ G11C 19/184
2012/0169709 A1 7/2012 Lee

FOREIGN PATENT DOCUMENTS

CN 103996367 A 8/2014
CN 105261340 A 1/2016
(Continued)

*Primary Examiner* — Rodney Amadiz
(74) *Attorney, Agent, or Firm* — Andrew C. Cheng (57) ABSTRACT

A GOA circuit includes a plurality of pull-up control units. An n-th stage pull-up control unit of top m-stage pull-up control units includes a signal-output-control circuit, a first switch unit, and a capacitor. The first switch unit includes a control terminal, a first terminal receiving an n-th stage clock signal, and a second terminal electrically connected with an nth-stage scanning line. The capacitor has a terminal electrically connected with the control terminal of the first switch unit and another terminal electrically connected with the second terminal of the first switch unit. The signal-output-control circuit charges the capacitor for a first time period and disconnects a discharging path of the capacitor for a second time period. The first time period and the second time period are consecutive time periods, and the second time period is subsequent to the first time period.

20 Claims, 7 Drawing Sheets

(51) Int. Cl.
   *H01L 29/417* (2006.01)
   *G02F 1/1345* (2006.01)
   *G02F 1/1368* (2006.01)

(52) U.S. Cl.
   CPC .. *H01L 29/41733* (2013.01); *H01L 29/42384* (2013.01); *G09G 2300/0809* (2013.01); *G09G 2310/0286* (2013.01); *G09G 2310/0291* (2013.01); *G09G 2310/08* (2013.01)

(58) Field of Classification Search
   CPC ...... G09G 2300/0809; H01L 29/41733; H01L 29/42384; G02F 1/1368; G02F 1/13454
   See application file for complete search history.

(56) References Cited

FOREIGN PATENT DOCUMENTS

| | | |
|---|---|---|
| CN | 105513530 A | 4/2016 |
| CN | 106652872 A | 5/2017 |
| CN | 106898290 A | 6/2017 |
| CN | 107274852 A | 10/2017 |

\* cited by examiner

Waveform of Q(1) of the GOA circuit of the conventional GOA circuit

Waveforms of Q(1) of the GOA circuit of the present invention

GOA CIRCUIT AND LCD DEVICE

BACKGROUND OF THE INVENTION

This application claims the priority of an application No. 201710697384.0 filed on Aug. 15, 2017, entitled "GOA circuit and LCD device", the contents of which are hereby incorporated by reference.

Field of Invention

The present invention relates to a liquid crystal display (LCD) device, and more particularly to a gate driver on array (GOA) and a LCD device.

Description of Prior Art

As common display devices, liquid crystal displays (LCDs) are favored by users due to its low power consumption, small size and light weight. The gate driver on array (GOA) circuit is a method in which gate driver integrated chips (ICs) are directly formed on an array substrate to replace the external chip. Because the GOA circuit can directly form the gate driving circuit around the LCD panel, the manufacturing process is reduced, thereby reducing the cost of the LCD device. In addition, since the GOA circuit forms the gate driving circuit on the array substrate, the integration of the LCD device is also improved. The conventional GOA circuit generally includes a pull-up control unit, a capacitor, and a switch unit. The switch unit comprises a control terminal, a first terminal, and a second terminal. One terminal of the capacitor is electrically connected with the pull-up control unit and the control terminal of the switch unit, and another terminal of the capacitor is electrically connected with the scanning line of the LCD device. When the scanning line is at a high level, a node between the capacitor and the control terminal of the switch unit is pulled to a higher level, due to the coupling effect of the capacitor, thereby facilitating the turn-on of the switch unit, thereby enabling the GOA circuit to work normally. However, since several stages of the pull-up control units (usually the top three stages) are often in an open state, the charges in the capacitors easily flow out via the pull-up control unit, so that the coupling effect of the capacitors becomes worse, when the coupling effect of the capacitance is poor to a specific level, the GOA circuit can not work normally.

SUMMARY OF THE INVENTION

The present invention provides a gate driver on array (GOA) circuit, applied to a liquid crystal display (LCD) device. The GOA circuit comprises a plurality of pull-up control units. An n-th stage pull-up control unit of top m-stage pull-up control units comprises a signal-output-control circuit, a first switch unit, and a capacitor. The first switch unit comprises a control terminal, a first terminal, and a second terminal. The control terminal of the first switch unit is electrically connected with one terminal of the capacitor, the first terminal of the first switch unit receives an n-th stage clock signal, and the second terminal of the first switch unit is electrically connected with an nth-stage scanning line. The terminal of the capacitor is electrically connected with the control terminal of the first switch unit and another terminal of the capacitor is electrically connected with the second terminal of the first switch unit. The signal-output-control circuit charges the capacitor for a first time period and disconnects a discharging path of the capacitor for a second time period. Wherein n is a positive integer M is a positive integer greater than or equal to n. The first time period and the second time period are consecutive time periods, and the second time period is subsequent to the first time period.

Comparing with the conventional art, the GOA circuit of the present invention comprises a plurality of pull-up control units. An n-th stage pull-up control unit of top m-stage pull-up control units comprises a signal-output-control circuit, a first switch unit, and a capacitor. The signal-output-control circuit charges the capacitor for the first time period and disconnects the discharging path of the capacitor for the second time period, so that a node between the capacitor and the control terminal of the first switch unit is pulled to a higher level due to the coupling effect of the capacitor, when the scanning line is at a high level during the first time period, which is good to turn on the first switch unit; and in a second time period, the pull-up control unit turns off the discharging path of the capacitor, so as to prevent the charge of the capacitor from being discharged, so that the coupling effect of the capacitor is not reduced, and the normal work of the GOA circuit is ensured.

The present further provides a LCD device, which comprises the GOA circuit.

BRIEF DESCRIPTION OF THE DRAWINGS

In order to describe the technical solutions in the embodiments of the present invention or in the conventional art more clearly, the accompanying drawings required for describing the embodiments or the conventional art are briefly introduced. Apparently, the accompanying drawings in the following description only show some embodiments of the present invention. For those skilled in the art, other drawings may be obtained based on these drawings without any creative work.

DETAILED DESCRIPTION OF THE PREFERRED EMBODIMENTS

The technical solutions in the embodiments of the present invention are clearly and completely described below with reference to the accompanying drawings in the embodiments of the present invention. Obviously, the described embodiments are only some embodiments of the present invention, rather than all of the embodiments. All other embodiments obtained by persons of ordinary skill in the art based on the embodiments of the present invention without creative efforts shall fall within the protection scope of the present invention.

Figure 1:
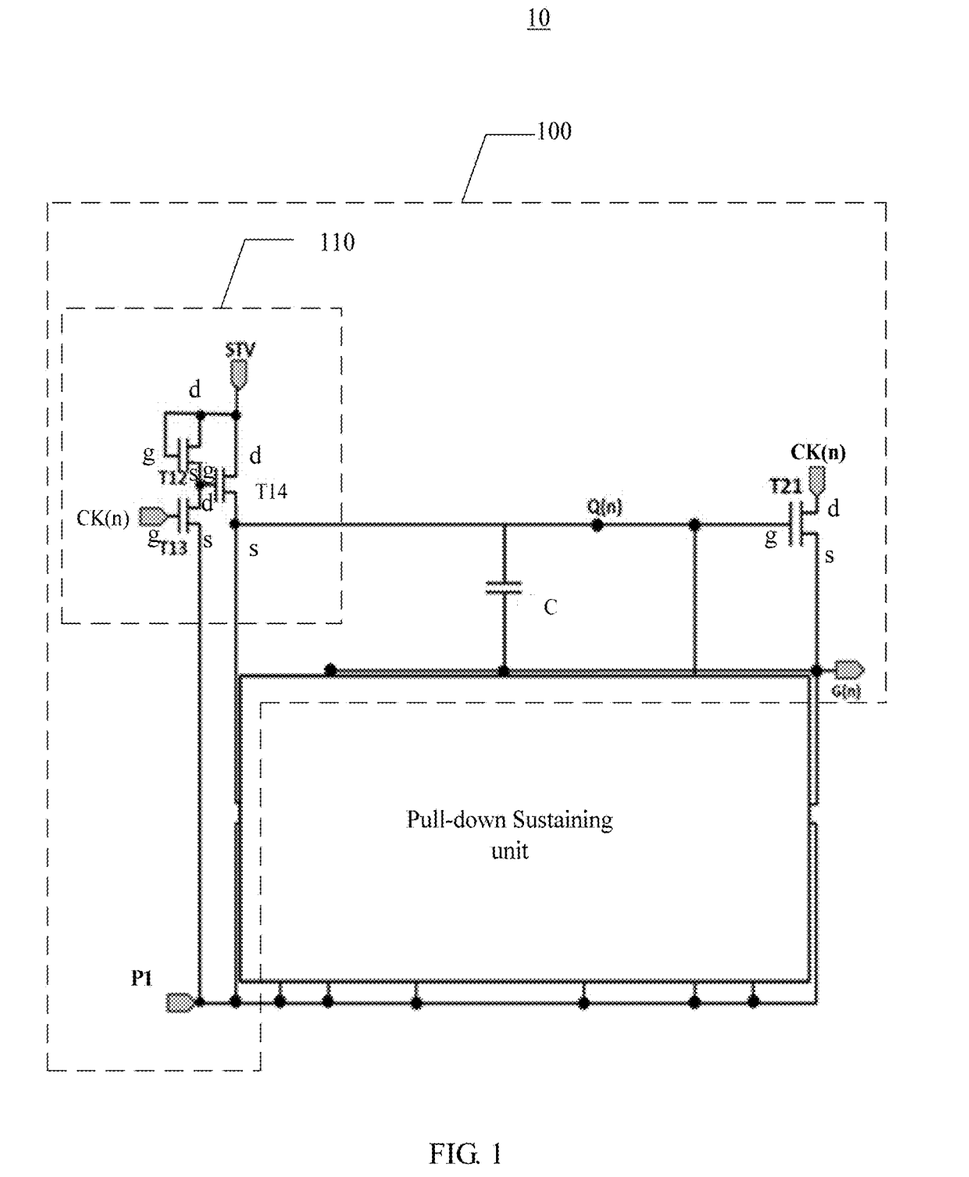
FIG. 1 is a structural illustrative diagram of a GOA circuit of a first embodiment according to the present invention.
Figure 2:
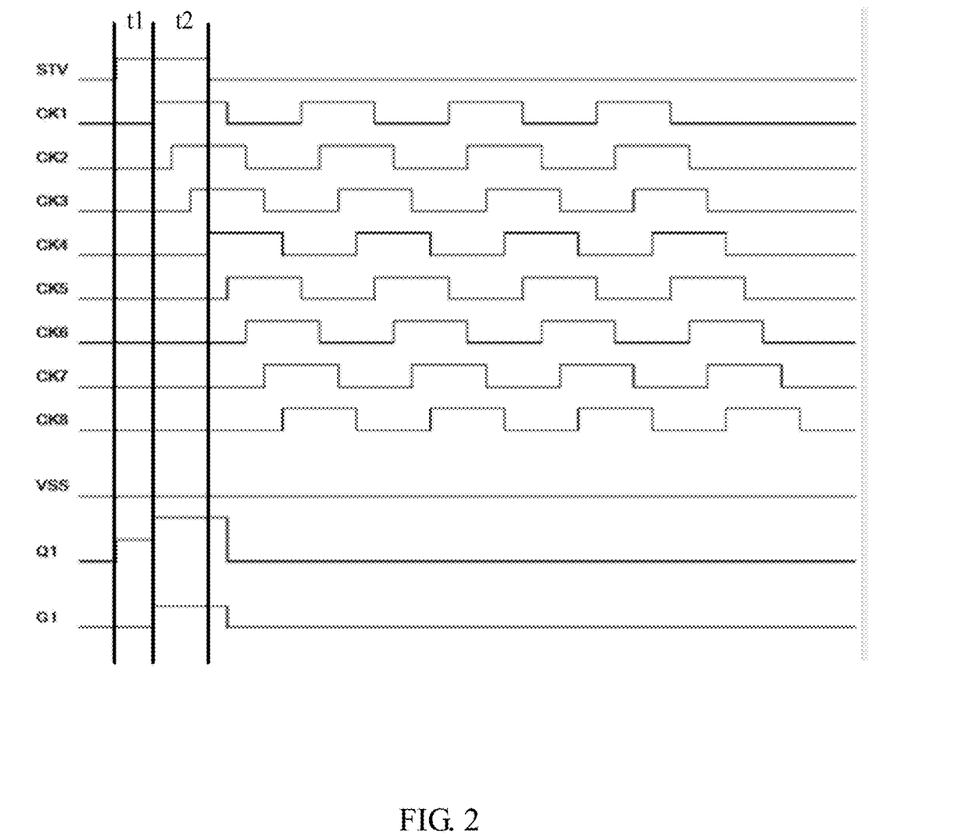
FIG. 2 is a waveform diagram of all signals of the GOA circuit of FIG. 1.

Please refer to FIGS. 1-2. FIG. 1 is a structural illustrative diagram of a GOA circuit of a first embodiment according to the present invention. FIG. 2 is a waveform diagram of all signals of the GOA circuit of FIG. 1.

A gate driver on array (GOA) circuit 10 is applied to a liquid crystal display (LCD) device 1. The GOA circuit 10 comprises a plurality of pull-up control units 100. An n-th stage pull-up control unit 100 of top m-stage pull-up control units 100 comprises a signal-output-control circuit 110, a first switch unit T21, and a capacitor C. The first switch unit T21 comprises a control terminal g, a first terminal d, and a second terminal s. The control terminal g of the first switch unit T21 is electrically connected with one terminal of the capacitor C, the first terminal d of the first switch unit T21 receives an n-th stage clock signal CK(n), and the second terminal s of the first switch unit T21 is electrically connected with an nth-stage scanning line G(n). The terminal of the capacitor C is electrically connected with the control terminal g of the first switch unit T21 and another terminal of the capacitor C is electrically connected with the second terminal d of the first switch unit T21. The signal-output-control circuit 110 charges the capacitor C for a first time period t1 and disconnects a discharging path of the capacitor C for a second time period t2. Wherein n is a positive integer M is a positive integer greater than or equal to n. The first time period and the second time period are consecutive time periods, and the second time period is subsequent to the first time period. In one embodiment, n is a positive integer less than or equal to 3, and m may be 3. In one embodiment, all the pull-up control units 100 in the top m-stage pull-up control units 100 are the same as the n-th stage pull-up control unit 100.

In the embodiment, the signal-output-control circuit 110 comprises a second switch unit T12, a third switch unit T13 and a fourth switch unit T14. During the first time period t1, the second switch unit T12 is turned on, the third switch unit T13 is turned off, the fourth switch unit T14 is turned on, and the capacitor C is charged. During the second time period t2, the second switch unit T12 is turned on, the third switch unit T13 is turned on, the fourth switch unit T14 is turned off, and the discharging path of the capacitor C is disconnected.

Specifically, the second switch unit T12, the third switch unit T13, and the fourth switch unit T14 all comprises a control terminal g, a first terminal d, and a second terminal s. Both the control terminal g of the second switch unit T12 and the first terminal d of the second switch unit T12 are loaded with a first signal, the second terminal s of the second switch unit T12 is electrically connected with the first terminal d of the third switch unit T13. The control terminal g of the third switch unit T13 receives the n-th stage clock signal CK(n), the second terminal s of the third switch unit T13 is electrically connected with a first node P1 to load a second signal. The control terminal g of the fourth switch unit T14 is electrically connected with the second terminal s of the second switch unit T12, the first terminal d of the fourth switch unit T14 is electrically connected with the first terminal d of the second switch unit T12, the second terminal s of the fourth switch unit T14 is electrically connected with the first node P1, and the second terminal s of the fourth switch unit T14 is electrically connected with the control terminal g of the first switch unit T21. During the first time period t1, the second switch unit T12 is turned on, the third switch unit T13 is turned off, the fourth switch unit T14 is turned on, and the capacitor C is charged. During the second time period t2, the second switch unit T12 is turned on, the third switch unit T13 is turned on, the fourth switch unit T14 is turned off, and the discharging path of the capacitor C is disconnected.

In the embodiment, the first switch unit T21, the second switch unit T12, the third switch unit T13, and the fourth switch unit T14 are all negative thin film transistors (NTFTs). The control terminal g is a gate electrode of the NTFT, the first terminal d is a drain electrode of the NTFT, and the second terminal s is a source electrode of the NTFT; or, the control terminal g is a gate electrode of the NTFT, the first terminal d is a source electrode of the NTFT, and the second terminal s is a drain electrode of the NTFT. Correspondingly, the first signal is a high-level signal and the second signal is a low-level signal. The n-th stage clock signal CK(n) is a low-level signal during the first time period t1 and the n-th stage clock signal CK(n) is a high-level signal during the second time period t2 (please refer to FIG. 2). In the embodiment, both the control terminal g of the second switch unit T12 and the first terminal d of the second switch unit T12 are connected with a second node P2, the second node P2 receives a starting signal STV of the LCD device 1 to load the first signal, the first node P1 receives a low-level signal (Vss) of the LCD device 1 to load the second signal.

For the convenience of description, the first stage clock signal, the second stage clock signal, the third stage clock signal, the fourth stage clock signal, the fifth stage clock signal, the sixth stage clock signal, the seventh stage clock signal, and the eighth stage clock signal are represented as CK1, CK2, CK3, CK4, CK5, CK6, CK7, and CK8 in FIG. 2. G(1) represents the signal loaded on the first stage scanning line.

Or, in other embodiment, the first switch unit T21, the second switch unit T12, the third switch unit T13, and the fourth switch unit T14 are all positive thin film transistors (PTFTs). The control terminal g is a gate electrode of the PTFT, the first terminal d is a drain electrode of the PTFT, and the second terminal s is a source electrode of the PTFT; or, the control terminal g is a gate electrode of the PTFT, the first terminal d is a source electrode of the PTFT, and the second terminal s is a drain electrode of the PTFT. Correspondingly, the first signal is a low-level signal and the second signal is a high-level signal. The n-th stage clock signal CK(n) is a high-level signal during the first time period t1 and the n-th stage clock signal CK(n) is a low-level signal during the second time period t2.

Comparing with the conventional art, the GOA circuit 10 of the present invention comprises a plurality of pull-up control units 100. An n-th stage pull-up control unit 100 of top m-stage pull-up control units 100 comprises a signal-output-control circuit 110, a first switch unit T21, and a capacitor C. The signal-output-control circuit 110 charges the capacitor C for the first time period t1 and disconnects the discharging path of the capacitor C for the second time period t2, so that a node Q(n) between the capacitor C and the control terminal g of the first switch unit T21 is pulled to a higher level due to the coupling effect of the capacitor C, when the scanning line is at a high level during the first time period t2, which is good to turn on the first switch unit T21; and in a second time period t2, the pull-up control unit 100 turns off the discharging path of the capacitor C, so as to prevent the charge of the capacitor C from being discharged, so that the coupling effect of the capacitor C is not reduced, and the normal work of the GOA circuit 10 is ensured.

Figure 3:
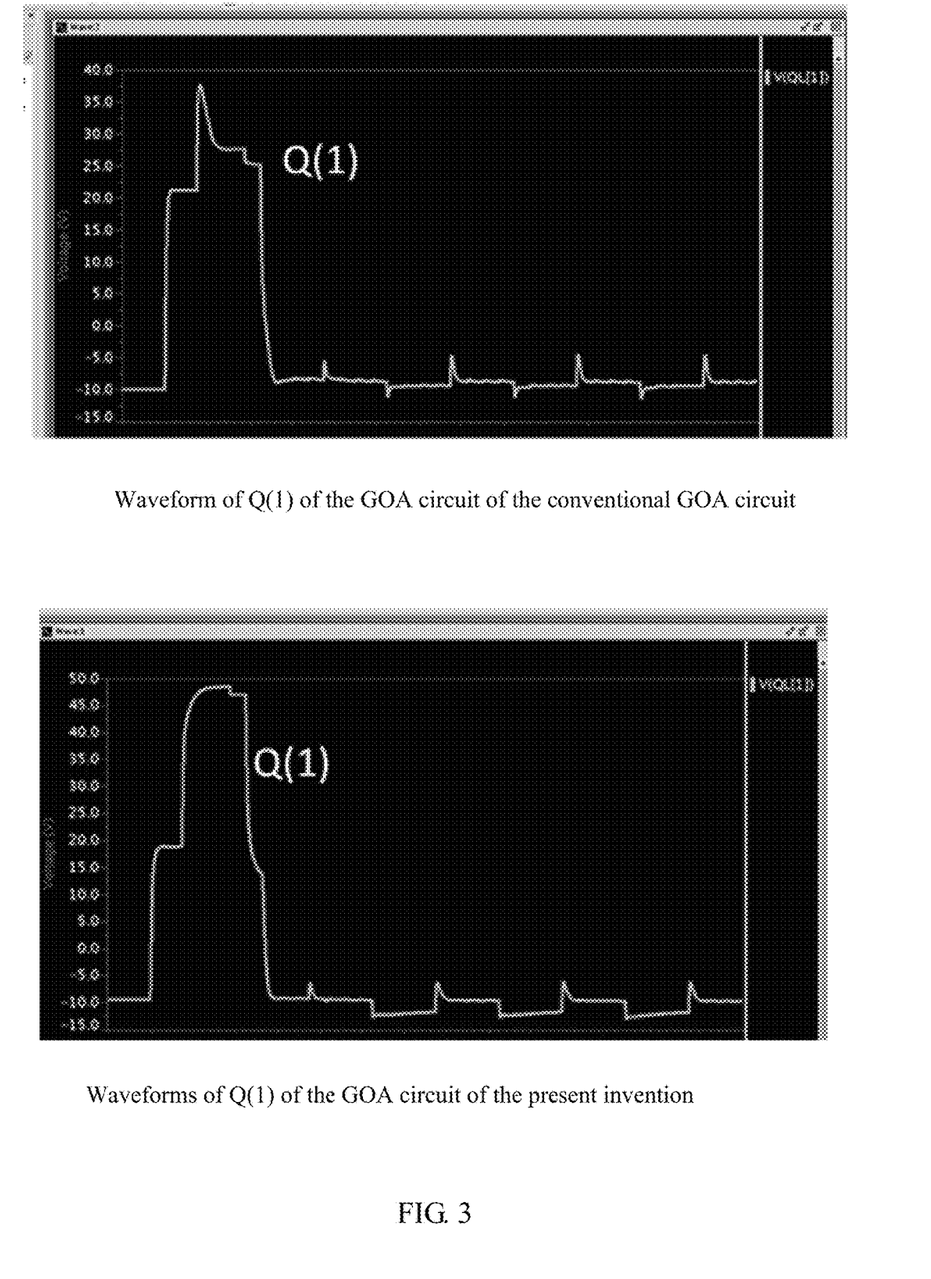
FIG. 3 is a comparative diagram of waveforms of Q(1) of the GOA circuit of the present invention and Q(1) of the conventional GOA circuit.

Please refer to FIG. 3, which is a comparative diagram of waveforms of Q(1) of the GOA circuit of the present invention and Q(1) of the conventional GOA circuit. For convenience of description, a node at one terminal of the capacitor C connected with the first switch unit T21 is marked as a node Q(n). In comparison with the waveform of the node Q(1) of the first level up-pull control unit 100 of the GOA circuit 10 of the present invention and the waveform of Q(1) of the conventional GOA circuit, the pull-up control unit 100 disconnects the discharging path of the capacitor C for the second time period t2, so as to prevent the charge of the capacitor C from being discharged, hence, a highest level of Q(1) of the GOA circuit of the present invention is higher than a highest level of Q(1) of the conventional GOA circuit.

Figure 4:
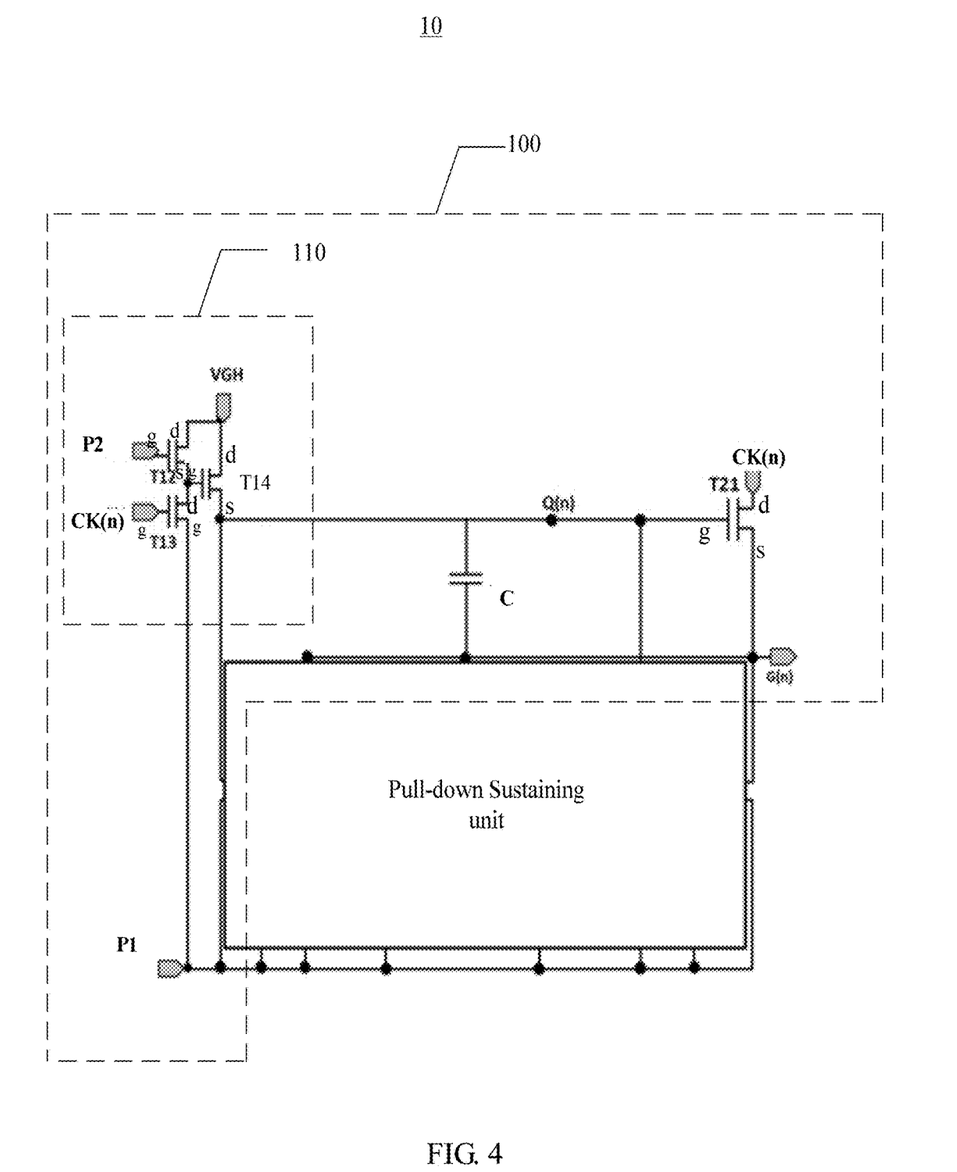
FIG. 4 is a structural illustrative diagram of a GOA circuit of a second embodiment according to the present invention.

Please refer to FIG. 4, which is a structural illustrative diagram of a GOA circuit of a second embodiment according to the present invention. The waveforms of the respective signals in the GOA circuit of the second embodiment are the same as the waveforms of the respective signals in the GOA circuit of the first embodiment, and will not be drawn here, please refer to FIG. 2. In the embodiment, the first switch unit T21, the second switch unit T12, the third switch unit T13, and the fourth switch unit T14 are all NTFTs. The first signal is a high-level signal and the second signal is a low-level signal. The n-th stage clock signal CK(n) is a low-level signal during the first time period t1 and the n-th stage clock signal CK(n) is a high-level signal during the second time period t2 (please refer to FIG. 2). The GOA circuit of the second embodiment is basically the same as the GOA circuit of the first embodiment. The difference is that in the present embodiment, the control terminal g of the second switch unit T12 is connected with a second node P2, the second node P2 receives a starting signal STV of the LCD device 1 to load the first signal, the first terminal d of the second switch unit T12 is connected with a direct current (DC) high-level power source VGH to load the first signal, the first node P1 receives a low-level signal Vss of the LCD device 1 to load the second signal.

It is understood that the first switch unit T21, the second switch unit T12, the third switch unit T13, and the fourth switch unit T14 are all NTFTs, the control terminal g is a gate electrode of the NTFT, the first terminal d is a drain electrode of the NTFT, and the second terminal s is a source electrode of the NTFT; or, the control terminal g is a gate electrode of the NTFT, the first terminal d is a source electrode of the NTFT, and the second terminal s is a drain electrode of the NTFT.

In other embodiments, the first switch unit T21, the second switch unit T12, the third switch unit T13, and the fourth switch unit T14 can be all PTFTs. The control terminal g is a gate electrode of the PTFT, the first terminal d is a drain electrode of the PTFT, and the second terminal s is a source electrode of the PTFT; or, the control terminal g is a gate electrode of the PTFT, the first terminal d is a source electrode of the PTFT, and the second terminal s is a drain electrode of the PTFT. Correspondingly, the first signal is a low-level signal and the second signal is a high-level signal. The n-th stage clock signal CK(n) is a high-level signal during the first time period t1 and the n-th stage clock signal CK(n) is a low-level signal during the second time period t2.

Figure 5:
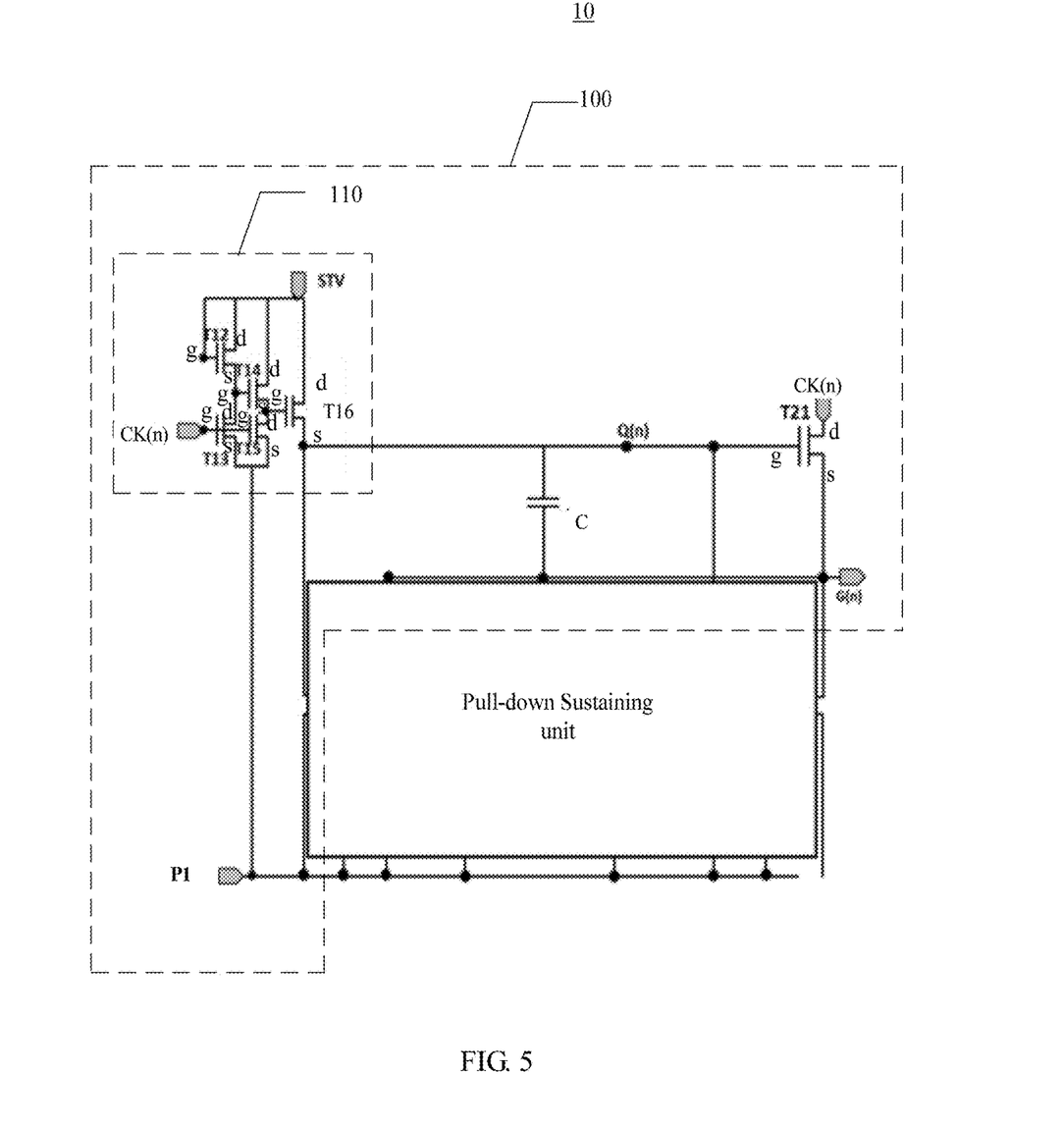
FIG. 5 is a structural illustrative diagram of a GOA circuit of a third embodiment according to the present invention.

Please refer to FIG. 5, which is a structural illustrative diagram of a GOA circuit of a third embodiment according to the present invention. The waveforms of the respective signals in the GOA circuit of the third embodiment are the same as the waveforms of the respective signals in the GOA circuit of the first embodiment, and will not be drawn here, please refer to FIG. 2. The signal-output-control circuit 110 comprises a second switch unit T12, a third switch unit T13, a fourth switch unit T14, a fifth switch unit T15, and a sixth switch unit T16. The the second switch unit T12, the third switch unit T13, the fourth switch unit T14, the fifth switch unit T15, and the sixth switch unit T16 all comprises a control terminal g, a first terminal d, and a second terminal s. Both the control terminal g of the second switch unit T12 and the first terminal d of the second switch unit T12 are loaded with a first signal, the second terminal s of the second switch unit T12 is electrically connected with the first terminal d of the third switch unit T13. The control terminal g of the third switch unit T13 receives the n-th stage clock signal CK(n), the second terminal s of the third switch unit T13 is electrically connected with a first node P1 to load a second signal. The control terminal g of the fourth switch unit T14 is electrically connected with a second terminal s of the second switch unit T12, the first terminal d of the fourth switch unit T14 receives the first signal, and the second terminal s of the fourth switch unit T14 is electrically connected with the first terminal d of the fifth switch unit T15. The control terminal g of the fifth switch unit T15 receives the n-th stage clock signal CK(n) and the second terminal s of the fifth switch unit T15 is electrically connected with a first node P1 to load the second signal. The control terminal g of the sixth switch unit T16 is electrically connected with the second terminal s of the fourth switch unit T14, the first terminal d of the sixth switch unit T16 is electrically connected with the first terminal d of the fourth switch unit T14, and the second terminal s of the sixth switch unit T16 is electrically connected with the first node P1 to load the second signal.

During the first time period t1, the second switch unit T12 is turned on, the third switch unit T13 is turned off, the fourth switch unit T14 is turned on, the fifth switch unit T15 is turned off, the sixth switch unit T16 is turned on, and the capacitor C is charged. During the second time period t2, the second switch unit T12 is turned on, the third switch unit T13 is turned on, the fourth switch unit T14 is turned off, and the discharging path of the capacitor C is disconnected.

In the embodiment, the first switch unit T21, the second switch unit T12, the third switch unit T13, the fourth switch unit T14, the fifth switch unit T15, and the sixth switch unit T16 are all NTFTs. The control terminal g is a gate electrode of the NTFT, the first terminal d is a drain electrode of the NTFT, and the second terminal s is a source electrode of the NTFT; or, the control terminal g is a gate electrode of the NTFT, the first terminal d is a source electrode of the NTFT, and the second terminal s is a drain electrode of the NTFT. Correspondingly, the first signal is a high-level signal and the second signal is a low-level signal. The n-th stage clock signal CK(n) is a low-level signal during the first time period t1 and the n-th stage clock signal CK(n) is a high-level signal during the second time period t2. The control terminal g of the second switch unit T12, the first terminal d of the second switch unit T12, and the first terminal d of the fourth switch unit T14 are all connected with a second node P2, the second node P2 receives a starting signal STV of the LCD device 1 to load the first signal, the second node P2 receives a low-level signal Vss of the LCD device 1 to load the second signal.

In the embodiment, the connection between the fourth switch unit T14 and the fifth switch unit T15 and the connection between the fourth switch unit T14 and the fifth switch unit T15 and the other connection between elements in the GOA circuit 100 can ensure that the gate electrode of the sixth switch unit T16 is turned off better, when the n-th clock signal CK(n) is a high-level signal, so that the discharging path of the capacitor C is closed better.

In other embodiments, the first switch unit T21, the second switch unit T12, the third switch unit T13, the fourth switch unit T14, the fifth switch unit T15, and the sixth switch unit T16 are all PTFTs. The control terminal g is a gate electrode of the PTFT, the first terminal d is a drain electrode of the PTFT, and the second terminal s is a source electrode of the PTFT; or, the control terminal g is a gate electrode of the PTFT, the first terminal d is a source electrode of the PTFT, and the second terminal s is a drain electrode of the PTFT. Correspondingly, the first signal is a low-level signal and the second signal is a high-level signal. The n-th stage clock signal CK(n) is a high-level signal during the first time period t1 and the n-th stage clock signal CK(n) is a low-level signal during the second time period t2.

Figure 6:
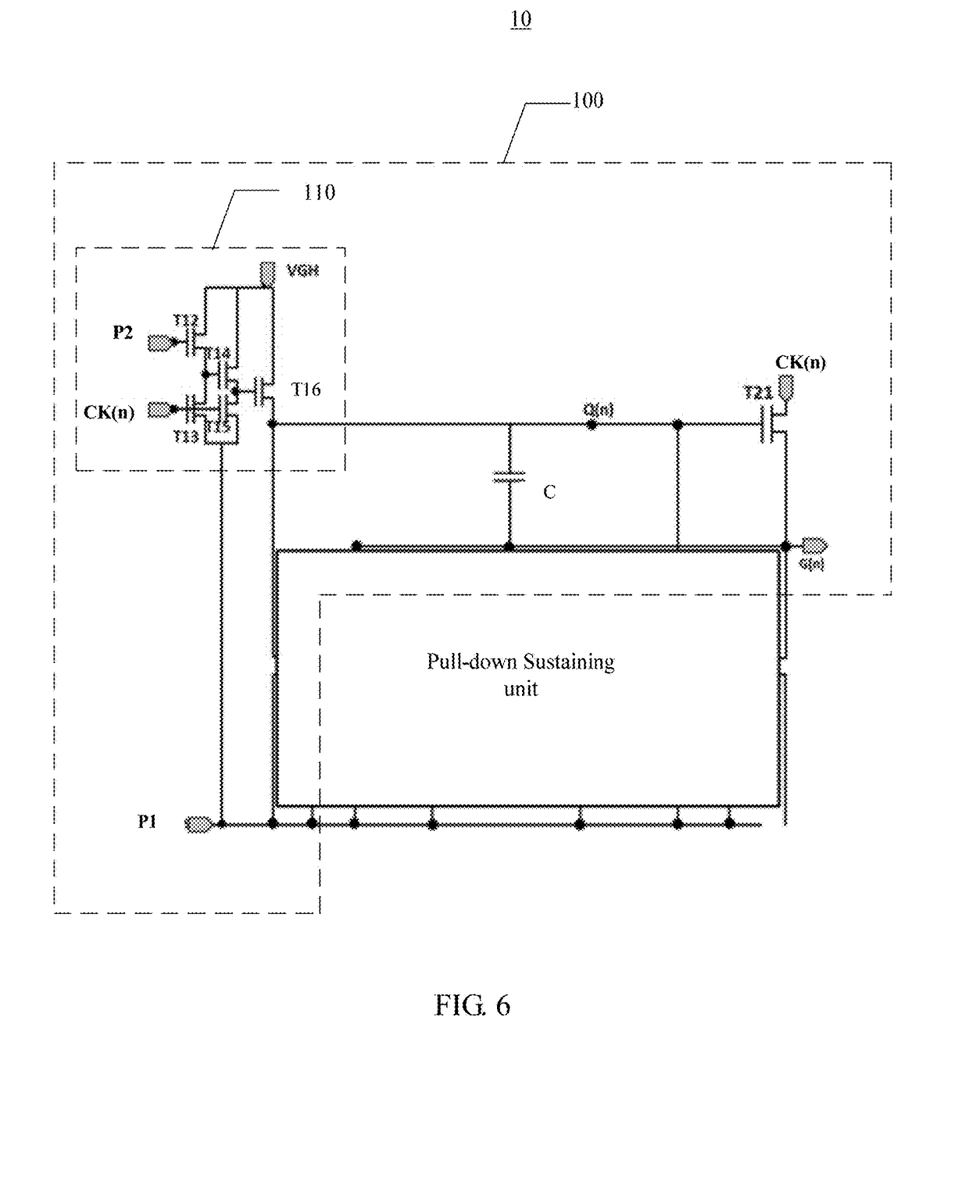
FIG. 6 is a structural illustrative diagram of a GOA circuit of a fourth embodiment according to the present invention.

Please refer to FIG. 6, which is a structural illustrative diagram of a GOA circuit of a fourth embodiment according to the present invention. The waveforms of the respective signals in the GOA circuit of the fourth embodiment are the same as the waveforms of the respective signals in the GOA circuit of the first embodiment, and will not be drawn here, please refer to FIG. 2. In the embodiment, the first switch unit T21, the second switch unit T12, the third switch unit T13, the fourth switch unit T14, the fifth switch unit T15, and the sixth switch unit T16 are all NTFTs. The first signal is a high-level signal and the second signal is a low-level signal. The n-th stage clock signal CK(n) is a low-level signal during the first time period t1 and the n-th stage clock signal CK(n) is a high-level signal during the second time period t2 (Please refer to FIG. 2). The GOA circuit of the fourth embodiment is basically the same as the GOA circuit of the third embodiment. The difference is that in the present embodiment, the control terminal g of the second switch unit T12 is connected with a second node P2, the second node P2 receives a starting signal STV of the LCD device 1 to load the first signal, the first terminal d of the second switch unit T12 and the first terminal d of the fourth switch unit T14 are both connected with a direct current (DC) high-level power source VGH to load the first signal, the first node P1 receives a low-level signal Vss of the LCD device 1 to load the second signal.

It is understood that the first switch unit T21, the second switch unit T12, the third switch unit T13, the fourth switch unit T14, the fifth switch unit T15, and the sixth switch unit T16 are all NTFTs, the control terminal g is a gate electrode of the NTFT, the first terminal d is a drain electrode of the NTFT, and the second terminal s is a source electrode of the NTFT; or, the control terminal g is a gate electrode of the NTFT, the first terminal d is a source electrode of the NTFT, and the second terminal s is a drain electrode of the NTFT.

In other embodiments, the first switch unit T21, the second switch unit T12, the third switch unit T13, the fourth switch unit T14, the fifth switch unit T15, and the sixth switch unit T16 can be all PTFTs. The control terminal g is a gate electrode of the PTFT, the first terminal d is a drain electrode of the PTFT, and the second terminal s is a source electrode of the PTFT; or, the control terminal g is a gate electrode of the PTFT, the first terminal d is a source electrode of the PTFT, and the second terminal s is a drain electrode of the PTFT. Correspondingly, the first signal is a low-level signal and the second signal is a high-level signal. The n-th stage clock signal CK(n) is a high-level signal during the first time period t1 and the n-th stage clock signal CK(n) is a low-level signal during the second time period t2.

Figure 7:
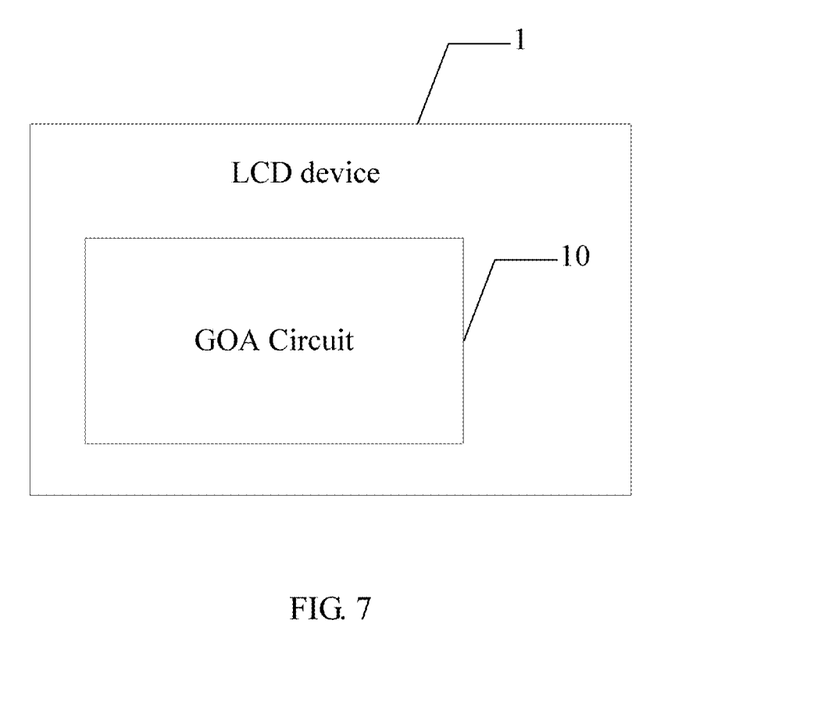
FIG. 7 is a structural illustrative diagram of a LCD device according to the present invention.

FIG. 7 is a structural illustrative diagram of a LCD device according to the present invention. The LCD device 1 comprises a GOA circuit 10, which can be referred to the foregoing description, which will not be further described herein. The LCD device 1 includes but is not limited to a mobile phone, a notebook computer, an electronic book, and the like.

The foregoing disclosure is merely one preferred embodiment of the present invention, and certainly can not be used to limit the scope of the present invention. A person having ordinary skill in the art may understand that all or part of the processes in the foregoing embodiments may be implemented, and the present invention may be implemented according to the present invention, equivalent changes in the requirements are still covered by the invention.

What is claimed is:

1. A gate driver on array (GOA) circuit, applied to a liquid crystal display (LCD) device, wherein the GOA circuit comprises a plurality of pull-up control units, an n-th stage pull-up control unit of top m-stage pull-up control units comprises a signal-output-control circuit, a first switch unit, and a capacitor, the first switch unit comprises a control terminal, a first terminal, and a second terminal, the control terminal of the first switch unit is electrically connected with one terminal of the capacitor, the first terminal of the first switch unit receives an n-th stage clock signal, and the second terminal of the first switch unit is electrically connected with an nth-stage scanning line, the terminal of the capacitor is electrically connected with the control terminal of the first switch unit, and another terminal of the capacitor is electrically connected with the second terminal of the first switch unit, the signal-output-control circuit charges the capacitor for a first time period and disconnects a discharging path of the capacitor for a second time period, wherein n is a positive integer M is a positive integer greater than or equal to n, the first time period and the second time period are consecutive time periods, and the second time period is subsequent to the first time period.

2. The GOA circuit according to claim 1, wherein the signal-output-control circuit comprises a second switch unit, a third switch unit and a fourth switch unit, during the first time period, the second switch unit is turned on, the third switch unit is turned off, the fourth switch unit is turned on, and the capacitor is charged; during the second time period, the second switch unit is turned on, the third switch unit is turned on, the fourth switch unit is turned off, and the discharging path of the capacitor is disconnected.

3. The GOA circuit according to claim 2, wherein the second switch unit, the third switch unit, and the fourth switch unit all comprises a control terminal, a first terminal, and a second terminal, both the control terminal of the second switch unit and the first terminal of the second switch unit are loaded with a first signal, the second terminal of the second switch unit is electrically connected with the first terminal of the third switch unit, the control terminal of the third switch unit receives the n-th stage clock signal, the second terminal of the third switch unit is electrically connected with a first node to load a second signal, the control terminal of the fourth switch unit is electrically connected with the second terminal of the second switch unit, the first terminal of the fourth switch unit is electrically connected with the first terminal of the second switch unit, the second terminal of the fourth switch unit is electrically connected with the first node, and the second terminal of the fourth switch unit is electrically connected with the control terminal of the first switch unit; during the first time period, the second switch unit is turned on, the third switch unit is turned off, the fourth switch unit is turned on, and the capacitor is charged; during the second time period, the second switch unit is turned on, the third switch unit is turned on, the fourth switch unit is turned off, and the discharging path of the capacitor is disconnected.

4. The GOA circuit according to claim 3, wherein the first switch unit, the second switch unit, the third switch unit, and the fourth switch unit are all positive thin film transistors (PTFTs), the first signal is a low-level signal, the second signal is a high-level signal, the n-th stage clock signal is a high-level signal during the first time period, and the n-th stage clock signal is a low-level signal during the second time period.

5. The GOA circuit according to claim 3, wherein the first switch unit, the second switch unit, the third switch unit, and the fourth switch unit are all negative thin film transistors (NTFTs), the first signal is a high-level signal, the second signal is a low-level signal, the n-th stage clock signal is a low-level signal during the first time period, and the n-th stage clock signal is a high-level signal during the second time period.

6. The GOA circuit according to claim 5, wherein both the control terminal of the second switch unit and the first terminal of the second switch unit are connected with a second node, the second node receives a starting signal of the LCD device to load the first signal, the first node receives a low-level signal of the LCD device to load the second signal.

7. The GOA circuit according to claim 3, wherein the control terminal of the second switch unit is connected with a second node, the second node receives a starting signal of the LCD device to load the first signal, the first terminal of the second switch unit is connected with a direct current (DC) high-level power source to load the first signal, the first node receives a low-level signal of the LCD device to load the second signal.

8. The GOA circuit according to claim 1, wherein the signal-output-control circuit comprises a second switch unit, a third switch unit, a fourth switch unit, a fifth switch unit, and a sixth switch unit; the second switch unit, the third switch unit, the fourth switch unit, the fifth switch unit, and the sixth switch unit all comprises a control terminal, a first terminal, and a second terminal, both the control terminal of the second switch unit and the first terminal of the second switch unit are loaded with a first signal, the second terminal of the second switch unit is electrically connected with the first terminal of the third switch unit, the control terminal of the third switch unit receives the n-th stage clock signal, the second terminal of the third switch unit is electrically connected with a first node to load a second signal, the control terminal of the fourth switch unit is electrically connected with a second terminal of the second switch unit, the first terminal of the fourth switch unit receivea the first signal, the second terminal of the fourth switch unit is electrically connected with the first terminal of the fifth switch unit, the control terminal of the fifth switch unit receives the n-th stage clock signal, the second terminal of the fifth switch unit is electrically connected with a first node to load the second signal, the control terminal of the sixth switch unit is electrically connected with the second terminal of the fourth switch unit, the first terminal of the sixth switch unit is electrically connected with the first terminal of the fourth switch unit, the second terminal of the sixth switch unit is electrically connected with the first node to load the second signal; during the first time period, the second switch unit is turned on, the third switch unit is turned off, the fourth switch unit is turned on, the fifth switch unit is turned off, the sixth switch unit is turned on, and the capacitor is charged; during the second time period, the second switch unit is turned on, the third switch unit is turned on, the fourth switch unit is turned off, and the discharging path of the capacitor is disconnected.

9. The GOA circuit according to claim 8, wherein the first switch unit, the second switch unit, the third switch unit, the fourth switch unit, the fifth switch unit, and the sixth switch unit are all positive thin film transistors (PTFTs), the first signal is a low-level signal, the second signal is a high-level signal, the n-th stage clock signal is a high-level signal during the first time period, and the n-th stage clock signal is a low-level signal during the second time period.

10. The GOA circuit according to claim 8, wherein the first switch unit, the second switch unit, the third switch unit, the fourth switch unit, the fifth switch unit, and the sixth switch unit are all negative thin film transistors (NTFTs), the first signal is a high-level signal, the second signal is a low-level signal, the n-th stage clock signal is a low-level signal during the first time period, and the n-th stage clock signal is a high-level signal during the second time period.

11. The GOA circuit according to claim 10, wherein the control terminal of the second switch unit, the first terminal of the second switch unit, and the first terminal of the fourth switch unit are all connected with a second node, the second node receives a starting singal of the LCD device to load the first signal, the second node receives a low-level signal of the LCD device to load the second signal.

12. The GOA circuit according to claim 10, wherein the control terminal of the second switch unit is connected with a second node, the second node receives a starting singal of the LCD device to load the first signal, the first terminal of the second switch unit and the first terminal of the fourth switch unit are both connected with a direct current (DC) high-level power source to load the first signal, the first node receives a low-level signal of the LCD device to load the second signal.

13. A liquid crystal display (LCD) device, comprising a gate driver on array (GOA) circuit, wherein the GOA circuit comprises a plurality of pull-up control units, an n-th stage pull-up control unit of top m-stage pull-up control units comprises a signal-output-control circuit, a first switch unit, and a capacitor, the first switch unit comprises a control terminal, a first terminal, and a second terminal, the control terminal of the first switch unit is electrically connected with one terminal of the capacitor, the first terminal of the first switch unit receives an n-th stage clock signal, and the second terminal of the first switch unit is electrically connected with an nth-stage scanning line, the terminal of the capacitor is electrically connected with the control terminal of the first switch unit, and another terminal of the capacitor is electrically connected with the second terminal of the first switch unit, the signal-output-control circuit charges the capacitor for a first time period and disconnects a discharging path of the capacitor for a second time period, wherein n is a positive integer M is a positive integer greater than or equal to n, the first time period and the second time period are consecutive time periods, and the second time period is subsequent to the first time period.

14. The LCD device according to claim 13, wherein the signal-output-control circuit comprises a second switch unit, a third switch unit and a fourth switch unit, during the first time period, the second switch unit is turned on, the third switch unit is turned off, the fourth switch unit is turned on, and the capacitor is charged; during the second time period, the second switch unit is turned on, the third switch unit is turned on, the fourth switch unit is turned off, and the discharging path of the capacitor is disconnected.

15. The LCD device according to claim 14, wherein the second switch unit, the third switch unit, and the fourth switch unit all comprises a control terminal, a first terminal, and a second terminal, both the control terminal of the second switch unit and the first terminal of the second switch unit are loaded with a first signal, the second terminal of the second switch unit is electrically connected with the first terminal of the third switch unit, the control terminal of the third switch unit receives the n-th stage clock signal, the second terminal of the third switch unit is electrically connected with a first node to load a second signal, the control terminal of the fourth switch unit is electrically connected with the second terminal of the second switch unit, the first terminal of the fourth switch unit is electrically connected with the first terminal of the second switch unit, the second terminal of the fourth switch unit is electrically connected with the first node, and the second terminal of the fourth switch unit is electrically connected with the control terminal of the first switch unit; during the first time period, the second switch unit is turned on, the third switch unit is turned off, the fourth switch unit is turned on, and the capacitor is charged; during the second time period, the second switch unit is turned on, the third switch unit is turned on, the fourth switch unit is turned off, and the discharging path of the capacitor is disconnected.

16. The LCD device according to claim 15, wherein the first switch unit, the second switch unit, the third switch unit, and the fourth switch unit are all positive thin film transistors (PTFTs), the first signal is a low-level signal, the second signal is a high-level signal, the n-th stage clock signal is a high-level signal during the first time period, and the n-th stage clock signal is a low-level signal during the second time period.

17. The LCD device according to claim 15, wherein the first switch unit, the second switch unit, the third switch unit, and the fourth switch unit are all negative thin film transistors (NTFTs), the first signal is a high-level signal, the second signal is a low-level signal, the n-th stage clock signal is a low-level signal during the first time period, and the n-th stage clock signal is a high-level signal during the second time period.

18. The LCD device according to claim 17, wherein both the control terminal of the second switch unit and the first terminal of the second switch unit are connected with a second node, the second node receives a starting signal of the LCD device to load the first signal, the first node receives a low-level signal of the LCD device to load the second signal.

19. The LCD device according to claim 15, wherein the control terminal of the second switch unit is connected with a second node, the second node receives a starting signal of the LCD device to load the first signal, the first terminal of the second switch unit is connected with a direct current (DC) high-level power source to load the first signal, the first node receives a low-level signal of the LCD device to load the second signal.

20. The LCD device according to claim 13, wherein the signal-output-control circuit comprises a second switch unit, a third switch unit, a fourth switch unit, a fifth switch unit, and a sixth switch unit; the second switch unit, the third switch unit, the fourth switch unit, the fifth switch unit, and the sixth switch unit all comprises a control terminal, a first terminal, and a second terminal, both the control terminal of the second switch unit and the first terminal of the second switch unit are loaded with a first signal, the second terminal of the second switch unit is electrically connected with the first terminal of the third switch unit, the control terminal of the third switch unit receives the n-th stage clock signal, the second terminal of the third switch unit is electrically connected with a first node to load a second signal, the control terminal of the fourth switch unit is electrically connected with a second terminal of the second switch unit, the first terminal of the fourth switch unit receivea the first signal, the second terminal of the fourth switch unit is electrically connected with the first terminal of the fifth switch unit, the control terminal of the fifth switch unit receives the n-th stage clock signal, the second terminal of the fifth switch unit is electrically connected with a first node to load the second signal, the control terminal of the sixth switch unit is electrically connected with the second terminal of the fourth switch unit, the first terminal of the sixth switch unit is electrically connected with the first terminal of the fourth switch unit, the second terminal of the sixth switch unit is electrically connected with the first node to load the second signal; during the first time period, the second switch unit is turned on, the third switch unit is turned off, the fourth switch unit is turned on, the fifth switch unit is turned off, the sixth switch unit is turned on, and the capacitor is charged; during the second time period, the second switch unit is turned on, the third switch unit is turned on, the fourth switch unit is turned off, and the discharging path of the capacitor is disconnected.

* * * * *